United States Patent
Ro

(10) Patent No.: US 8,453,184 B2
(45) Date of Patent: May 28, 2013

(54) CIRCUIT FOR TRANSMITTING/RECEIVING VIDEO SIGNAL USING POWER LINE

(75) Inventor: Chung-Yoon Ro, Gyeonggi-do (KR)

(73) Assignee: Remo Tek. Co., Ltd., Suwon (KR)

( * ) Notice: Subject to any disclaimer, the term of this patent is extended or adjusted under 35 U.S.C. 154(b) by 1058 days.

(21) Appl. No.: 12/294,230

(22) PCT Filed: Mar. 23, 2007

(86) PCT No.: PCT/KR2007/001418
§ 371 (c)(1),
(2), (4) Date: May 5, 2009

(87) PCT Pub. No.: WO2007/111441
PCT Pub. Date: Oct. 4, 2007

(65) Prior Publication Data
US 2009/0316052 A1  Dec. 24, 2009

(30) Foreign Application Priority Data

Mar. 24, 2006 (KR) .................. 10-2006-0026755
Feb. 12, 2007 (KR) .................. 10-2007-0014157

(51) Int. Cl.
*H04N 7/18* (2006.01)

(52) U.S. Cl.
USPC ................................................ 725/79

(58) Field of Classification Search
USPC ..................... 725/79, 130; 340/538
See application file for complete search history.

(56) References Cited

U.S. PATENT DOCUMENTS

| | | | | |
|---|---|---|---|---|
| 4,745,391 A | * | 5/1988 | Gajjar | 307/104 |
| 4,980,665 A | * | 12/1990 | Schotz | 455/23 |
| 5,625,863 A | * | 4/1997 | Abraham | 725/79 |
| 5,712,614 A | * | 1/1998 | Patel et al. | 725/78 |
| 6,532,268 B1 | * | 3/2003 | Morisawa | 375/257 |
| 7,205,894 B1 | * | 4/2007 | Savage | 340/568.6 |

FOREIGN PATENT DOCUMENTS

| | | |
|---|---|---|
| KR | 10-2000-0032364 B1 | 6/2000 |
| KR | 10-2000-0078610 A | 12/2000 |
| WO | 02/13406 A1 | 2/2002 |
| WO | 03/094382 A1 | 11/2003 |

* cited by examiner

*Primary Examiner* — Vivek Srivastava
*Assistant Examiner* — Junior Mendoza
(74) *Attorney, Agent, or Firm* — Seed IP Law Group PLLC

(57) ABSTRACT

The present invention is relating to a circuit for transmitting and receiving an image signal using a power line, wherein the transmitting circuit comprises; a bias unit for controlling a bias voltage of an image signal taken by a CCD camera; a differential amplifier, to which a power is supplied through a voltage drop unit, for amplifying the image signal which has passed through the bias unit into the broad-band signal; an oscillator IC, which is driven by using the image signal amplified into the broadband signal by the differential amplifier as an input power, for modulating the image signal while loading the image signal into the carrier frequency of an oscillation frequency; and transformers for inducing an alternating current image signal from the image signal modulated by the oscillator IC and outputting the image signal to the AC power line; and a receiving circuit comprises; a rectifier for supplying the AC power through the AC power line as a power required for operation; a transformer for inducing an alternating current image signal by an LC-tuned frequency with respect to an alternating current image signal received through the AC power line; an amplifier for amplifying the alternating current image signal to correct a receiving sensitivity; and an output amplifier for amplifying the output of the amplified image signal. Thereby, the circuit for transmitting and receiving an image signal using a power line according to the present invention can be characteristically manufactured at a low cost and installed with ease.

2 Claims, 3 Drawing Sheets

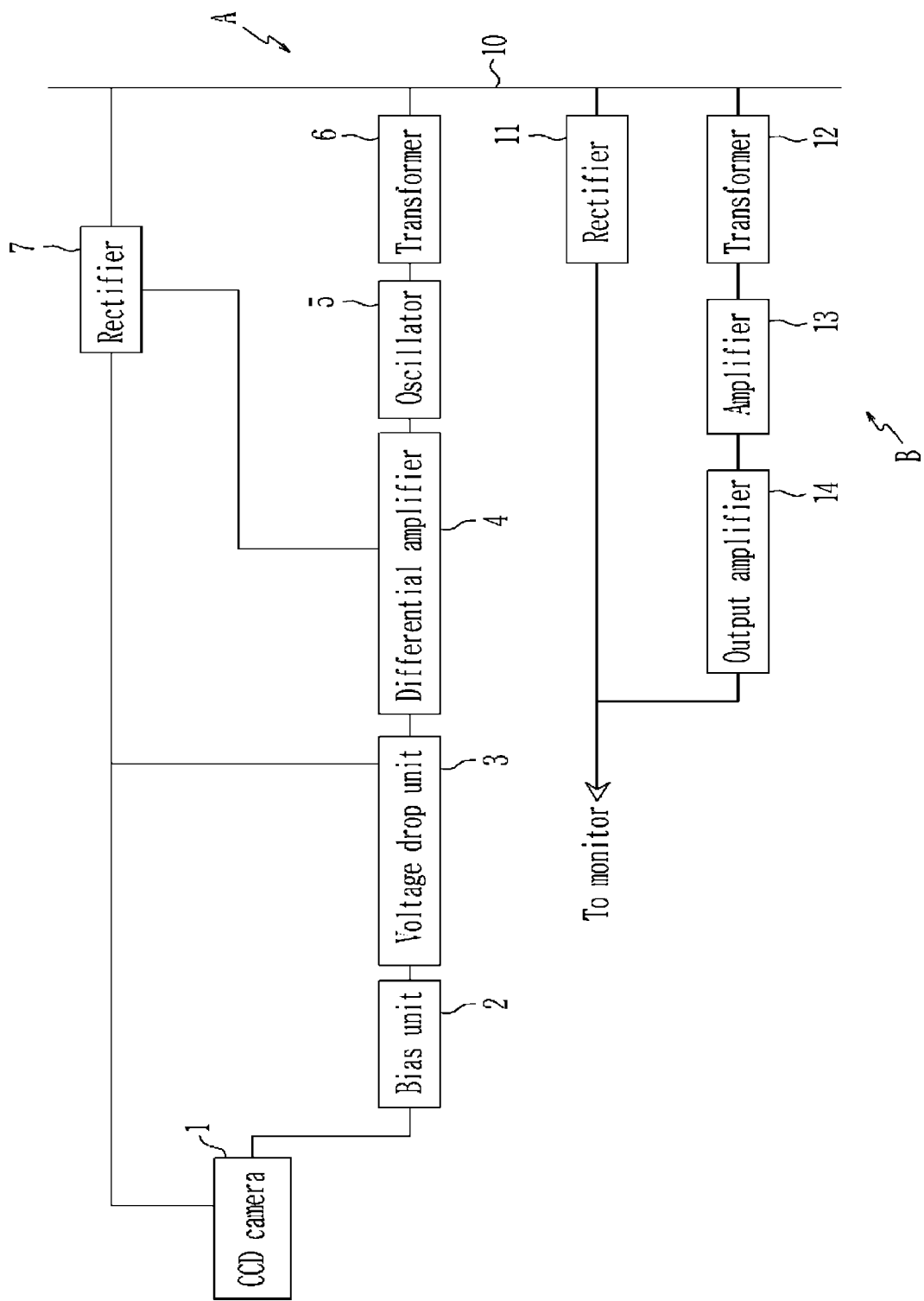
[Fig. 1]

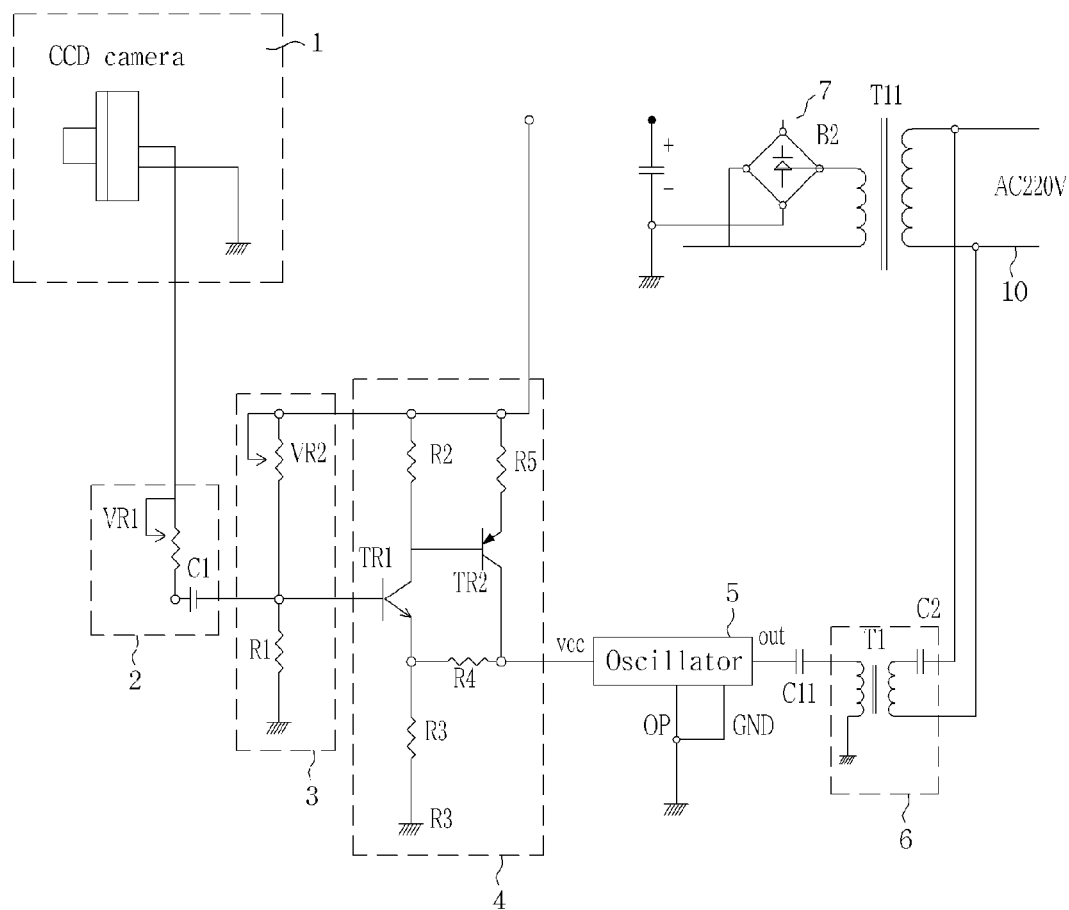
[Fig. 2]

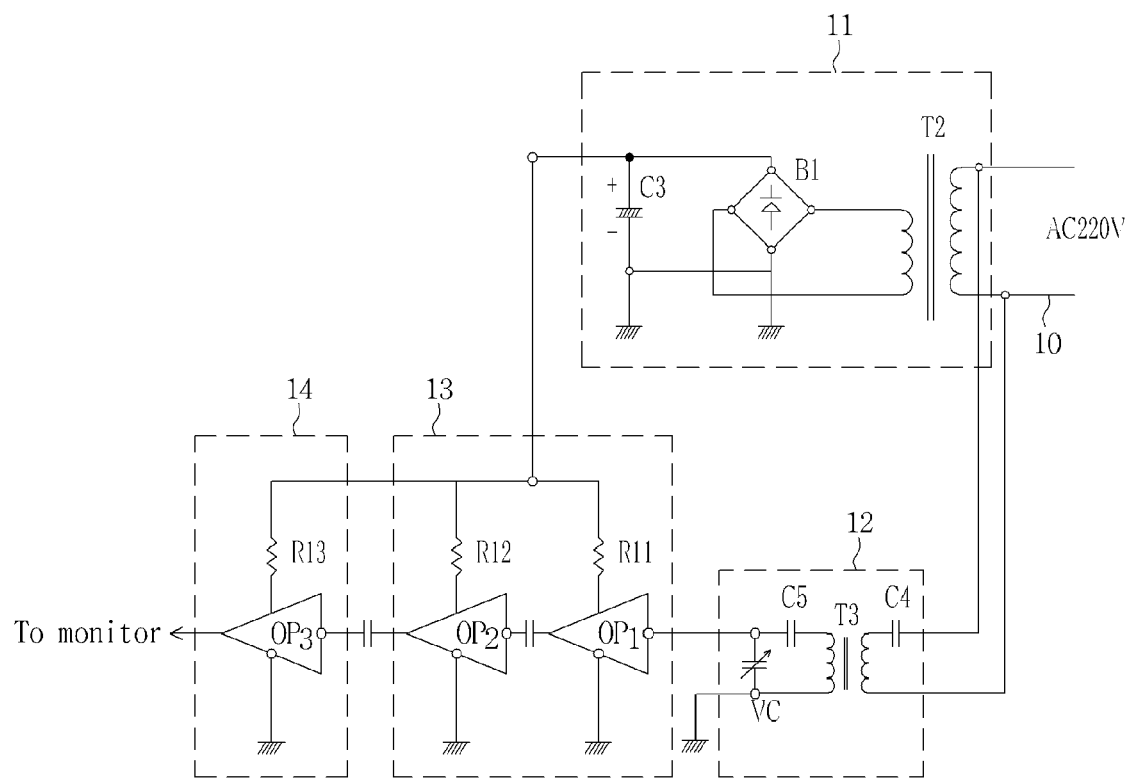
[Fig. 3]

CIRCUIT FOR TRANSMITTING/RECEIVING VIDEO SIGNAL USING POWER LINE

TECHNICAL FIELD

The present invention is relating to a circuit for transmitting and receiving an image signal using a power line, and more particularly to a circuit for transmitting and receiving an image signal using a power line so that a clear image may be viewed by a simple configuration without a leased line or a separated modem by modulating an image signal, which is taken by a camera and then amplified, via an oscillator IC into a synthesized and modulated waveform, then demodulating the synthesized and modulated waveform, which is transmitted or received through the power line, into the image signal at the oscillator IC, and then amplifying and transmitting the image to a monitor.

BACKGROUND ART

Today, it has been possible to edit an image taken by a camera while watching it through a monitor using a computer so as to make a home page or a presentation material, output the edited image to an output device such as a printer, or store it in a hard disk drive or a compact disc.

For example, it has been possible to make a home page using an image taken by a camera over the Internet as connected, prepare various reports by inserting the image taken, and make an electronic album with photos in commemoration of graduation and marriage or store them in a record medium such as a diskette.

That is to say, a conventional camera is constructed of a lens for magnifying and penetrating a light source of an object; a charge coupled device (CCD) for converting a light signal of the object into an electric signal; a noise canceller for cancelling a noise of the electric signal; a digital signal processor (DSP) for processing the signal whose noise has been cancelled by the noise canceller into the image data; a main controller for operating an outputted signal of the digital signal processor (DSP) and controlling the entire system; a memory for storing the information of the main controller and the entire system; a decoder/selector for inputting external image signals from a plurality of cameras and selecting and outputting desired image signals; an image signal compressor for compressing an image signal; a RS-232C port connected to a computer for outputting an image signal stored in the memory; an Ethernet connected to a network line on which a control signal is transmitted and received; and a power supply for converting a voltage inputted from an AC adapter into various levels of voltage used in the camera and supplying it.

In the case of the conventional camera constructed as described above, the image signal taken by the camera is transmitted to the computer through a cable for data transmission as connected to the RS-232C port, and the image signal stored in the computer memory is also transmitted to another user's computer to which it is intended to be transmitted through the transmitting device over a commercial communication network and the Internet.

Further, a signal to control the camera in the computer is transmitted to the Ethernet of the camera through the network line.

In order to transmit the image signal of the camera to an external device, a cable for data transmission and a network cable should be separately installed.

Also, in the case of CCTV, a lot of cables should be installed in order to transmit image signals between a camera installed in a distant place and a monitoring center.

Thus, it is inconvenient to install cables and maintain the installed cables. Further, there is a problem to expend a high cost for installation of cables.

Korean patent application No. 10-2000-0032364 (entitled CAMERA HAVING A POWER LINE COMMUNICATION (PLC) MODEM) filed on Jun. 13, 2000 was suggested to solve the above problems with the conventional camera.

The suggested camera is a camera capable of transmitting and receiving image signals and control signals to and from the computer, wherein a power line communication modem for transmitting the image signal of the camera to the computer through the power line and the control signal of the computer to the camera through the power line is connected to an output end of the camera so that data may be transmitted over the power line without a separate line for data transmission.

However, in the case of the camera having the conventional power line communication (PLC) modem, the power line communication modem should be separately installed in the transmitting side and the receiving side respectively, and as a result, there are disadvantages that its configuration as well as operation for signal conversion becomes complicated.

Meanwhile, in a cable broadcasting system, a transmitting station transmits a broadcasting signal including a voice signal and an image signal to a receiving station on a cable. Thus, the cable to transmit the broadcasting signal to the receiving station should be installed to each broadcasting receiver in order to operate such cable broadcasting system.

As said above, since a leased cable to connect between the transmitting station and the receiving station should be installed in the conventional cable broadcasting system, a high equipment cost is required to operate the cable broadcasting system, which causes a problem of deteriorating economical efficiency.

So, Korean patent application No. 10-2000-0078610 (entitled CABLE BROADCASTING SYSTEM USING A power line) filed on Dec. 19, 2000 was suggested. The suggested system comprises a transmitting station for transmitting a broadcasting signal including a voice signal and an image signal through a power line; and a receiving station for receiving a broadcasting signal transmitted from the transmitting station through the power line and outputting it confirmably.

Wherein the transmitting station comprises a signal generator for generating a broadcasting signal including the voice signal and the image signal which are to be provided to the broadcasting receiver; a modulator for modulating the broadcasting signal applied from the signal generator into a given frequency different from an alternating current power frequency; and an alternating current power cut-off unit for cutting off the alternating current power applied from the power line so that it may not be applied to the modulator and transmitting the broadcasting signal applied from the modulator to the power line; and the receiving station comprises an alternating current power cut-off unit for cutting off an alternating current power applied from the power line and transmitting the broadcasting signal applied from the power line; and a demodulator for demodulating the broadcasting signal applied from the alternating current power cut-off unit, extracting the voice signal and the image signal and outputting them to a receiving device.

However, the conventional cable broadcasting system using the power line has shortcomings that the configuration of the modulator and the demodulator becomes complicated and modulating and demodulating operations are complicated.

DISCLOSURE OF INVENTION

Technical Problem

The present invention is made to solve the said problems, and its object is to provide a circuit for transmitting and receiving an image signal using a power line so that a clear image may be viewed by a simple configuration without a leased line or a separated modem by modulating an image signal, which is taken by a camera and then amplified, via an oscillator IC into a synthesized and modulated waveform, then de-modulating the synthesized and modulated waveform, which is transmitted or received through the power line, into the image signal at the oscillator IC, and then amplifying and transmitting it to a monitor.

Technical Solution

In the circuit for transmitting and receiving an image signal using a power line according to the present invention to accomplish the said object, wherein the transmitting circuit comprises;

a bias unit for controlling a bias voltage of an image signal taken by a CCD camera;

a voltage drop unit for converting a supplied power into a driving power required to process the signal;

a differential amplifier for amplifying the image signal which has passed through the bias unit into the broad-band signal;

an oscillator IC, which is driven by using the image signal amplified into the broadband signal by the differential amplifier as an input power, for modulating the image signal while loading the image signal into the carrier frequency of an oscillation frequency; and a transformer for inducing an alternating current image signal from the image signal modulated by the oscillator IC and outputting the image signal to the AC power line after processing it for withstanding voltage; and wherein the receiving circuit comprises;

a rectifier for supplying the AC power supplied through the AC power line as a required operating power;

a transformer for inducing an alternating current image signal by an LC-tuned frequency with respect to an alternating current image signal received through the AC power line;

an amplifier for amplifying the alternating current image signal to correct a receiving sensitivity; and an output amplifier for amplifying the output of the amplified image signal. Thereby, the circuit for transmitting and receiving an image signal using a power line according to the present invention can be characteristically manufactured at a low cost and installed with ease.

BRIEF DESCRIPTION OF THE DRAWINGS

FIG. 1 is a block diagram schematically illustrating the entire configuration of the present invention.

FIG. 2 is a circuit diagram illustrating the configuration of a transmitting circuit of the present invention.

FIG. 3 is a circuit diagram illustrating the configuration of a receiving circuit of the present invention.

BEST MODE FOR CARRYING OUT THE INVENTION

Hereinafter, a preferable embodiment of the present invention will be described by reference to the accompanying drawings as follows.

In the circuit for transmitting and receiving an image signal using a power line according to the present invention, the transmitting circuit (A) comprises;

a bias unit (2) for controlling a bias voltage of an image signal taken by a CCD camera (1);

a voltage drop unit (3) for converting the supplied power of 12V into a driving power required to process the signal;

a differential amplifier (4) for amplifying the image signal which has passed through the bias unit (2) into the broad-band signal;

an oscillator IC (5), which is driven by using the image signal amplified into the broad-band signal by the differential amplifier (4) as an input power, for modulating the image signal while loading the image signal into the carrier frequency of an oscillation frequency;

a transformer (6) for inducing an alternating current image signal from the image signal modulated by the oscillator IC (5) while it is passing through a transformer (T1) and outputting the image signal to the AC power line (10) after processing it for withstanding voltage; and a rectifier (7) for supplying the DC power required for operation after rectifying the AC power supplied from the AC power line (10) while dropping its voltage; and the receiving circuit (B) comprises;

a rectifier (11) for supplying the AC power supplied through the AC power line (10) as a required operating power;

a transformer (12) for inducing an alternating current image signal by an LC-tuned frequency with respect to an alternating current image signal received through the AC power line (6);

an amplifier (13) for amplifying the alternating current image signal to correct a receiving sensitivity; and an output amplifier (14) for amplifying the output of the amplified image signal.

Mode For The Invention

FIG. 2 illustrates the configuration of the transmitting circuit, which comprises;

a bias unit (2), which is of a variable resistor (VR1) and a condenser (C1), for controlling a bias voltage of the image signal taken by the CCD camera (1), which has a bandwidth of 15.4 KHz to 4 KHz;

a voltage drop unit (3), which is of a variable resistor (VR2) and a resistor (R1), for converting the supplied power of 12V into the driving power required to process the signal;

a differential amplifier (4), which is of an NPN transistor (TR1) and a PNP transistor (TR2), for amplifying the image signal which has passed through the bias unit (2) into the broadband signal;

an oscillator IC (5), which is driven by using the image signal amplified into the broad-band signal by the differential amplifier (4) as an input power, for modulating the image signal while loading the image signal into the carrier frequency of an oscillation frequency;

a transformer (6) for inducing an alternating current image signal at the secondary side by the condition that the image signal modulated by the oscillator IC (5) is applied to the primary side of the transformer (T1) and outputting the image signal of the alternating current induced at the secondary side to the AC power line (10) after processing it for withstanding voltage at the condenser (C2); and a rectifier (7) for supplying the DC power required for operation after rectifying the AC power supplied from the AC power line (10) using a bridge diode (B2) while dropping its voltage by the transformer (T11).

FIG. 3 shows a receiving circuit, which comprises;

a rectifier (11) for inducing an AC power, of which the voltage has dropped, at the secondary side of the transformer (T2) when the AC power through the AC power line (10) is induced at the primary side, thereby rectifying it through a bridge diode (B1) and a condenser (C3) and then supplying the rectified DC power as the power required for operation;

a transformer (12) for inducing an alternating current image signal at the secondary side by the LC tuned frequency through an inductance of the transformer (T3), a condenser (C5) and a variable condenser (VC) at the secondary side when the alternating current image signal received through the AC power line (10) is induced at the primary side of a transformer (T3) through a condenser (C4);

an amplifier (13) for amplifying the alternating current image signal to correct a receiving sensitivity while amplifying it in 2 steps by the amplifiers (OP1)(OP2); and an output amplifier (14) for amplifying the amplified image signal through the amplifier (OP3) in order to output it to a monitor through the line.

In the circuit for transmitting and receiving an image signal using a power line in accordance with the present invention, which is configured as described above;

the bias voltage of the image signal having a bandwidth of 15.4 KHz to 4 MHz, which is taken by the CCD camera (1), is controlled by the variable resistor (VR1) and the condenser (C1) of the bias unit (2) and transmitted as an image signal having the waveform.

The 12V supplied power is converted into a driving power required to process the signal by the variable resistor (VR2) and the resistor (R1) of the voltage drop unit (3).

The image signal, which has passed through the bias unit (2), is amplified into a broadband signal while it passes through the NPN transistor (TR1) and the PNP transistor (TR2) of the differential amplifier (5).

The oscillator IC (5) driven by using an image signal, which is amplified into a broadband signal by the differential amplifier (5), as an input power, modulates the image signal while loading the image signal into the carrier frequency of the oscillation frequency, and thereby it becomes an image signal of a synthesized and modulated waveform.

The image signal modulated by the oscillator IC (5) is applied to the primary side of the transformer (T1) of the transformers (6), and then the alternating current image signal induced at the secondary side of the transformer (T1) is outputted to the AC power line (10) after processing it at the condenser (C2) for withstanding voltage.

The DC power required to operate the circuit is supplied by rectifying the AC power supplied from the AC power line (10) through the bridge diode (B2)Z at the transformer (T11) of the rectifier (7) while dropping its voltage there.

*When the AC power from the AC power line (10) is induced at the primary side of the transformer (T2) of the rectifier (11), the AC power, of which the voltage is dropped, is induced at the secondary side of the transformer and the DC power rectified by the bridge diode (B1) and the condenser (C3) is supplied as the power for operating the circuit.

When the alternating current image signal received through the AC power line (10) is induced at the primary side of the transformer (T3) of the transformers (12) after it has passed through the condenser (C4), an alternating current image signal is induced at the secondary side of the transformer (T3) by the LC tuned frequency made by the inductance, the condenser (C5) and the variable condenser (VC) of the transformer and thereby the image signal is demodulated.

The alternating current image signal is amplified to correct a receiving sensitivity while it is amplified in two steps by the amplifiers (OP1) and (OP2) of the amplifiers.

The amplified image signal is amplified through the amplifier (OP3) of the output amplifiers (14) so that it may be outputted to a monitor through the line, and thereby the image signal is transmitted to the monitor.

INDUSTRIAL APPLICABILITY

As described above, the circuit for transmitting and receiving an image signal using a power line has such an effect that a clear image can be viewed by a simple configuration without a leased line or a separated modem by modulating an image signal, which is taken by a camera and then amplified, via an oscillator IC into a synthesized and modulated waveform, transmitting the modulated image signal through a transformer and the AC power line, demodulating the synthesized and modulated waveform, which is received through the power line, into the image signal by the LC tuned frequency of the transformer, and amplifying and transmitting the demodulated image signal to a monitor.

The invention claimed is:

1. A circuit for transmitting and receiving an image signal using a power line,
wherein a transmitting circuit comprises:
a bias unit, which is of a variable resistor and a first condenser, for controlling a bias voltage of an image signal taken by a CCD camera;
a voltage drop unit, which is of a variable resistor and a resistor, for converting a supplied power of 12V into a driving power required to process the image signal;
a differential amplifier, which is of an NPN transistor and a PNP transistor, for amplifying the image signal which has passed through the bias unit into a broadband signal;
an oscillator IC, which is driven by using the image signal amplified into the broadband signal by the differential amplifier as an input power, for modulating the image signal while loading the image signal into a carrier frequency of an oscillation frequency; and
a first transformer for inducing an alternating current image signal at a secondary side of the first transformer by a condition that the image signal modulated by the oscillator IC is applied to a primary side of the first transformer and outputting the image signal of an alternating current induced at the secondary side to an AC power line after processing the image signal for withstanding voltage at a second condenser, and
wherein a receiving circuit comprises:
a rectifier for supplying an AC power through the AC power line as a power required for operation;
a second transformer for inducing an alternating current image signal by an LC-tuned frequency with respect to the alternating current image signal received through the AC power line;
an amplifier for amplifying the induced alternating current image signal to correct a receiving sensitivity; and
an output amplifier for amplifying an output of the amplified alternating current image signal.

2. A circuit for transmitting and receiving an image signal using a power line,
wherein a transmitting circuit comprises:
a bias unit for controlling a bias voltage of an image signal taken by a CCD camera;
a voltage drop unit for converting a supplied power of 12V into a driving power required to process the image signal;
a differential amplifier for amplifying the image signal which has passed through the bias unit into a broadband signal;
an oscillator IC for modulating the image signal amplified into the broadband signal by the differential amplifier; and
a first transformer for converting the image signal modulated by the oscillator IC into an alternating current image signal, processing the alternating current image signal for withstanding voltage and outputting the alternating current image signal to the AC power line, and
wherein a receiving circuit comprises:
a rectifier for rectifying AC power induced at a secondary side of a second transformer through a bridge diode and a first condenser when the AC power through the AC power line is induced at a primary side of the second transformer;
a third transformer for inducing an alternating current image signal at the secondary side by an LC tuned frequency through an inductance of the third transformer, a second condenser and a variable condenser at the secondary side of the third transformer when the alternating current image signal received through the AC power line is induced at the primary side of the third transformer through a third condenser;

an amplifier for amplifying the induced alternating current image signal to correct a receiving sensitivity while amplifying the induced alternating current image signal in two steps by two amplifiers; and an output amplifier for amplifying the amplified image signal through the output amplifier in order to output the amplified image signal to a monitor through the AC power line.

* * * * *